(12) United States Patent
Kim et al.

(10) Patent No.: US 9,449,993 B2
(45) Date of Patent: Sep. 20, 2016

(54) DISPLAY APPARATUS

(71) Applicant: LG Display Co., Ltd., Seoul (KR)

(72) Inventors: Miso Kim, Seoul (KR); DaeSung Jung, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/969,240

(22) Filed: Dec. 15, 2015

(65) Prior Publication Data
US 2016/0190166 A1 Jun. 30, 2016

(30) Foreign Application Priority Data
Dec. 31, 2014 (KR) .................. 10-2014-0195870

(51) Int. Cl.
*H01L 29/04* (2006.01)
*H01L 27/12* (2006.01)

(52) U.S. Cl.
CPC ......... *H01L 27/124* (2013.01); *H01L 27/1255* (2013.01)

(58) Field of Classification Search
CPC .................. H01L 27/124; H01L 27/1255
USPC ............................................... 257/71
See application file for complete search history.

(56) References Cited

U.S. PATENT DOCUMENTS

| 2015/0223355 A1* | 8/2015 | Fleck | G06F 1/163 361/679.03 |
| 2015/0236167 A1* | 8/2015 | Yamazaki | H01L 29/7869 257/43 |
| 2016/0027380 A1* | 1/2016 | Kim | G09G 3/3258 315/172 |
| 2016/0035284 A1* | 2/2016 | Jung | G06F 1/163 345/206 |

* cited by examiner

*Primary Examiner* — David S Blum
(74) *Attorney, Agent, or Firm* — Morgan, Lewis & Bockius LLP

(57) ABSTRACT

A display apparatus includes a substrate having a display area defined in a non rectangular shape, and a non-display area surrounding the display area; an image display portion including a plurality of gate lines, a plurality of data lines and a plurality of pixels prepared on the display area; a display pad portion prepared at one side of the substrate; a plurality of data link lines for connecting the plurality of data lines to the display pad portion; and one or more dummy capacitors prepared in some data link lines among the plurality of data link lines.

16 Claims, 10 Drawing Sheets

DISPLAY APPARATUS

CROSS REFERENCE TO RELATED APPLICATIONS

This application claims the benefit of the Korean Patent Application No. 10-2014-0195870 filed on Dec. 31, 2014, which is hereby incorporated by reference as if fully set forth herein.

BACKGROUND

1. Field of the Disclosure

The present invention relates to a display apparatus, and more particularly, to a display apparatus having a circular shaped display portion.

2. Discussion of the Related Art

Generally, display devices have been widely used as display screens of various products such as televisions, notebook computers and monitors as well as portable electronic devices such as mobile communication terminals, electronic diaries, electronic books, portable multimedia players (PMPs), navigation systems, ultra mobile PCs (UM-PCs), mobile phones, smart phones, tablet PCs (personal computers) and watch phones.

Recently, as importance in appearance and design of the display device has been considered and attention of consumers to wearable devices such as a watch phone has been increased, studies and developments of a display device having a circular display portion not a rectangular display portion have been made.

FIG. 1 illustrates a related art display apparatus having an image display portion.

With reference to FIG. 1, the related art display apparatus having an image display portion may include a substrate 10, an image display portion 20 including a plurality of data lines DL1 to DLm and a plurality of gate lines (not shown) prepared on the substrate 10, a display pad portion 30 prepared at one side of the substrate 10, and a plurality of data link lines DLL1 to DLLm for connecting the plurality of data lines DL1 to DLm to the display pad portion 30.

In case of the related art display apparatus having an image display portion, the outermost pixels prepared in the image display portion 20 are disposed to be a circular shape at maximum, whereby the plurality of data link lines DLL1 to DLLm have the different lengths by each data line DL1 to DLm. Especially, the first data link line DLL1 and the last data link line DLLm respectively connected to the first data line DL1 and the last data line DLm are disposed nearly parallel to the adjacent data link line DLL. Thus, a voltage variation, which is caused in accordance with a coupling phenomenon by a parasitic capacitance between the adjacent data link lines DLL, is gradually increased from the middle data link line DLLi toward the first and last data link lines DLL1 and DLLm. The deviation of coupling phenomenon by the parasitic capacitance by each position of the data link lines DLL causes degradation of image quality. For example, if the image display portion 20 is displayed in a line-by-line pattern for alternately displaying a white image and a black image in a unit of each data line, voltages of the adjacent data lines are simultaneously increased or decreased due to the coupling phenomenon of white and black voltages by the parasitic capacitance between the data link lines DLL. This voltage variation caused by the coupling phenomenon is more serious in the left and right edges of the image display portion 20, which might cause a color disorder in the left and right edges of the image display portion 20, for example, reddish phenomenon.

The above description for the related art liquid crystal display device relates to the information searched for the present invention or obtained in a studying process of the present invention. That is, the above description is not a prior art disclosed to the general public before an application of the present invention.

SUMMARY

Accordingly, embodiments of the present invention are directed to a display apparatus that substantially obviate one or more problems due to limitations and disadvantages of the related art.

An object of the present invention is to provide a display apparatus which is capable of minimizing picture quality deterioration in an image display portion by a voltage coupling of a parasitic capacitance.

Another object of the present invention is to provide a display apparatus having an image display portion and a thin bezel width.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, a display apparatus comprises a substrate having a display area defined in a non rectangular shape, and a non-display area surrounding the display area; an image display portion including a plurality of gate lines, a plurality of data lines and a plurality of pixels prepared on the display area; a display pad portion prepared at one side of the substrate; a plurality of data link lines for connecting the plurality of data lines to the display pad portion; and one or more dummy capacitors prepared in some data link lines among the plurality of data link lines.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, a display device according to the preferred embodiment of the present invention will be described in detail with reference to the accompanying drawings. Wherever possible, the same reference numbers will be used throughout the drawings to refer to the same or like parts. Also, in the following description of the present invention, if detailed description of elements or functions known in respect of the present invention is determined to make the subject matter of the present invention unnecessarily obscure, the detailed description will be omitted.

Figure 1:
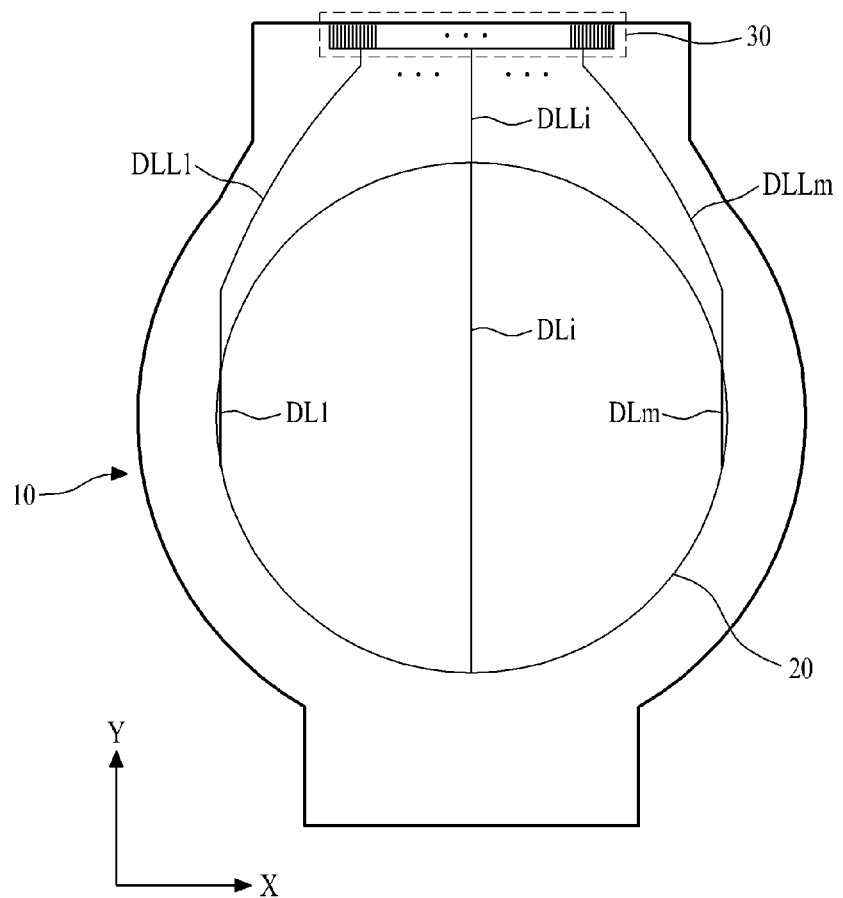
FIG. 1 illustrates a related art display apparatus having an image display portion.
Figure 2:
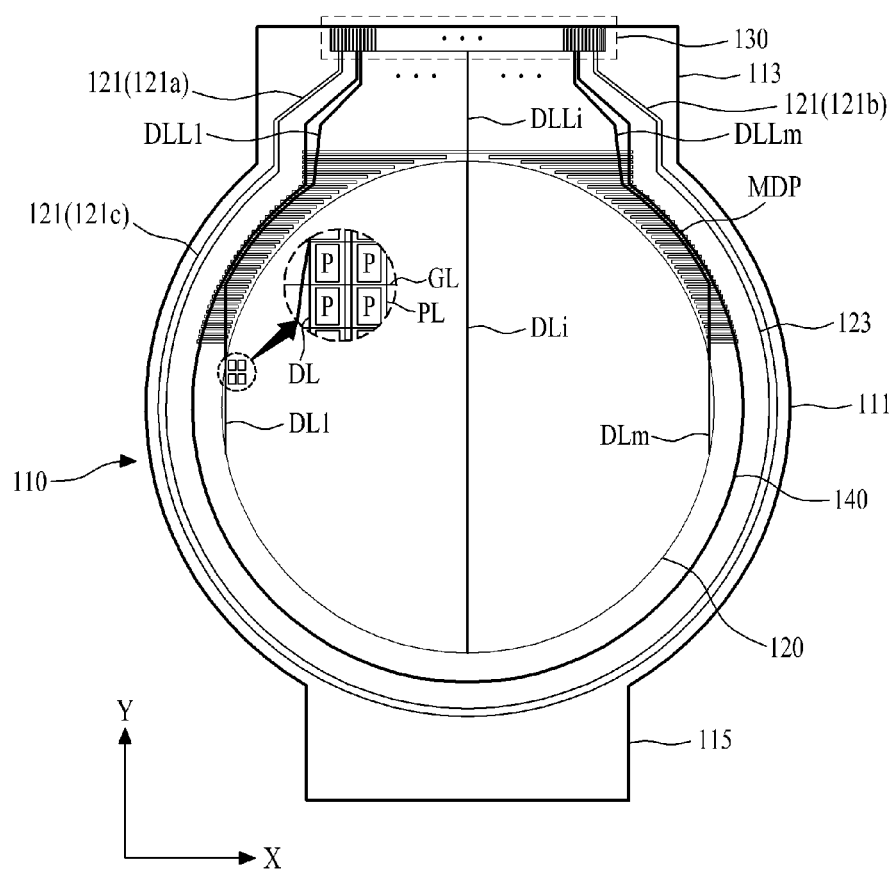
FIG. 2 is a plane view illustrating a display apparatus according to a first example embodiment of the present invention.

FIG. 2 is a plane view illustrating a display apparatus according to a first example embodiment of the present invention.

With reference to FIG. 2, the display apparatus according to the first embodiment of the present invention may include a substrate 110, an image display portion 120, a display pad portion 130, a plurality of data link lines DLL1 to DLLm, a reference power line 140, and a plurality of metal dummy patterns MDP.

The substrate 110 may be formed of a flexible plastic material, for example, opaque or colored polyimide (PO, but not limited to this material. The substrate 110 may be formed of a glass substrate. The substrate 110 may include a circular-shaped curve portion 111, and an upper neck portion 113 which is projected in a rectangular shape from one side of the curve portion 111. Additionally, the substrate 110 may further include a lower neck portion 115 which is projected in a rectangular shape from the other side of the curve portion 111 in opposite to one side of the curve portion 111.

The curve portion 111 is formed in a non rectangular shape, for example, circular shape, wherein the curve portion 111 includes a display area defined in a non rectangular shape, and a non-display area surrounding the display area.

The upper neck portion 113 is projected (or extended) in a rectangular shape with a predetermined size from an upper side of the non-display area of the curve portion 111. The lower neck portion 115 is projected (or extended) in a rectangular shape with a predetermined size from a lower side of the non-display area of the curve portion 111.

The image display portion 120 may include a pixel array prepared in the display area.

The pixel array may include a plurality of data lines DL1 to DLm, a plurality of gate lines GL, a plurality of pixel power lines PL, and a plurality of pixels P.

The plurality of data lines DL1 to DLm are prepared in the image display portion 120 and are provided at fixed intervals along a first lengthwise direction (X) of the substrate 110.

The plurality of gate lines GL are prepared in the image display portion 120 and are provided at fixed intervals along a second lengthwise direction (Y) of the substrate 110 which is perpendicular to the first lengthwise direction (X). Each of the gate lines GL is connected to a gate driving circuit (not shown) prepared in the non-display area of the substrate 110 along the left and right circumferences of the image display portion 120. In response to a gate control signal supplied through a gate control signal line and the display pad portion 130, the gate driving circuit generates a gate signal, and sequentially supplies the generated gate signal to the plurality of gate lines GL.

The plurality of pixel power lines PL are prepared in the image display portion 120, and are respectively provided in parallel to the plurality of data lines DL1 to DLm. The plurality of pixel power lines PL are connected to a driving power supply line 121 prepared in the non-display area.

Each of the plurality of pixels P is prepared at each intersection of the gate lines GL and the data lines DL1 to DLm, wherein the plurality of pixels P are arranged at a matrix configuration in the display area. In this case, the pixels P adjacent to the non-display area may be arranged in a shape of a stair in accordance with the circumference of the display area (See FIG. 11). That is, since rectangular pixels are arranged along the circumference of the display area, the circumference of the display area is substantially formed in a shape of a stair instead of a circle. However, if the image display portion 120 has resolution more than a certain level, since the circumference of the display area is perceived in a shape of a circle, the circumference of the display area comprised of a fine stair shape by pixel arrangement may be regarded as a circle shape. For this reason, it may be regarded that the curve portion 111 and the image display portion 120 are substantially formed in a shape of a concentric circle. Additionally, dummy pixels (see FIG. 11; DP) may be formed at a boundary portion of the display area and the non-display area along the circumference of the display area. The dummy pixels may serve to prevent actual pixels P for displaying images from being damaged by external static electricity. At this time, the same number of dummy pixels or one or more dummy pixels may be formed at both ends of each pixel row formed in the display area, and the same number of dummy pixels or different number of dummy pixels may be formed in each pixel row along the circumference of the display area.

Figure 3:
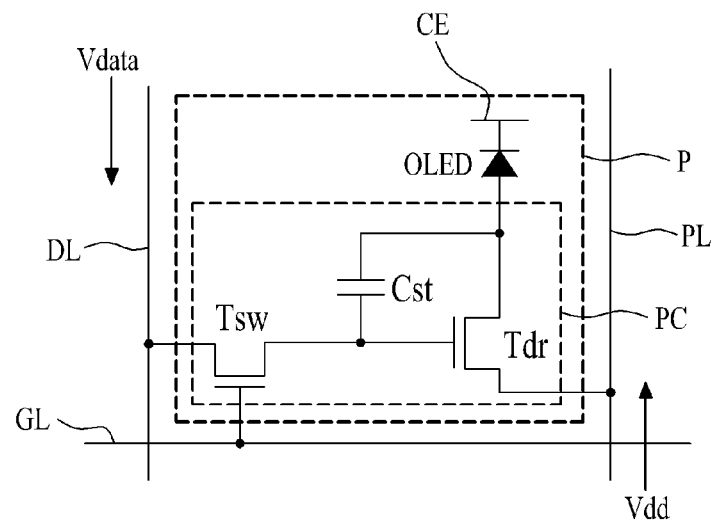
FIG. 3 illustrates an example of a pixel shown in FIG. 2.

Each of the plurality of pixels P may include a pixel circuit PC and an organic light emitting diode OLED, as shown in FIG. 3.

The pixel circuit PC is connected to its adjacent gate line GL, data line DL and pixel power line PL, wherein the pixel circuit PC controls a current flowing in the organic light emitting diode OLED in accordance with a data signal Vdata from the data line DL in response to a gate signal from the gate line GL. The pixel circuit PC may include a switching transistor Tsw, a driving transistor Tdr, and a capacitor Cst. In this case, the transistor Tsw and Tdr is a thin film transistor TFT, which may be a-Si TFT, poly-Si TFT, oxide TFT, or organic TFT.

The switching transistor Tsw is switched in accordance with the gate signal supplied to the gate line GL, and supplies the data signal Vdata, which is supplied to the data line DL, to the driving transistor Tdr. The driving transistor Tdr is switched in accordance with the data signal Vdata supplied from the switching transistor Tsw, and controls a data current flowing in the organic light emitting diode OLED from the pixel power line PL. The capacitor Cst is connected between a gate terminal and a source terminal of the driving transistor Tdr to store a voltage corresponding to the data signal Vdata supplied to the gate terminal of the driving transistor Tdr, and turns on the driving transistor Tdr by the stored voltage.

The organic light emitting diode OLED may include an anode electrode (or pixel electrode) connected to the source terminal of the driving transistor Tdr, an organic light emitting layer formed on the anode electrode, and a cathode electrode layer CE formed on the organic light emitting layer. The organic light emitting diode OLED displays a predetermined image by emitting light in accordance with the data current supplied from the driving transistor Tdr.

Figure 4:
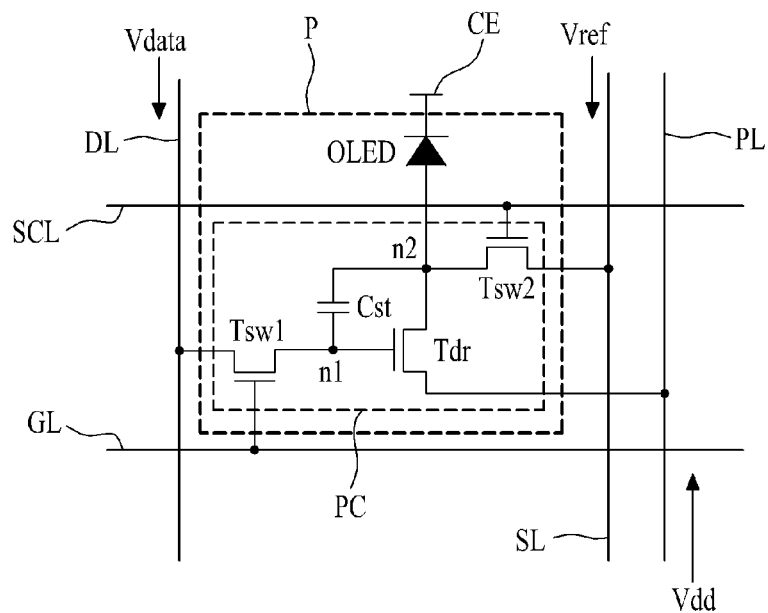
FIG. 4 illustrates another example of a pixel shown in FIG. 2.

Each of the plurality of pixels P according to another example may include a pixel circuit PC and an organic light emitting diode OLED, as shown in FIG. 4.

The pixel circuit PC may include a first switching transistor Tsw1, a second switching transistor Tsw2, a driving transistor Tdr, a capacitor Cst, and an organic light emitting diode OLED. In this case, the transistor Tsw1, Tsw2, and Tdr is a thin film transistor TFT, which may be a-Si TFT, poly-Si TFT, oxide TFT, or organic TFT.

The first switching transistor Tsw1 is switched in accordance with the gate signal supplied to the gate line GL, and supplies the data signal Vdata, which is supplied to the data line DL, to a gate electrode of the driving transistor Tdr, that is, first node n1.

The second switching transistor Tsw2 is switched in accordance with a sensing control signal supplied to a sensing control line SCL which is parallel to the gate line GL, and supplies a sensing line SL to a source electrode of the driving transistor Tdr, that is, second node n2.

For an external sensing mode of sensing the change of properties in the driving transistor Tdr included in each pixel P, the second switching transistor Tsw2 transmits a current flowing in the driving transistor Tdr to the sensing line SL. For a display mode of displaying an image in each pixel P, the second switching transistor Tsw2 supplies a reference voltage Vref, which is supplied to the sensing line SL, to the second node n2. The second switching transistor Tsw2 may be switched in accordance with the gate signal supplied to the gate line GL. In this case, it is possible to omit the sensing control line SCL.

The sensing line SL prepared in each pixel P is formed in parallel to each of the plurality of data lines DL, and is connected to a display driving circuit through the display pad portion 130. Each of the plurality of sensing lines SL is connected to a sensing circuit (not shown) of the display driving circuit for the external sensing mode, and is connected to a reference voltage source (not shown) of the display driving circuit for the display mode.

The capacitor Cst is connected between the gate and source electrodes of the driving transistor Tdr, that is, between the first and second nodes n1 and n2. The capacitor Cst is charged with a differential voltage Vdata-Vref between the voltages supplied to the first and second nodes n1 and n2 in accordance with the switching of each of the first and second switching transistors Tsw1 and Tsw2, and then the capacitor Cst switches the driving transistor Tdr in accordance with the charged voltage.

The driving transistor Tdr is turned-on by the voltage of the capacitor Cst, and controls an amount of current flowing from a driving voltage line to the organic light emitting diode OLED.

The organic light emitting diode OLED may include an anode electrode (or pixel electrode) connected to the source terminal of the driving transistor Tdr, an organic light emitting layer formed on the anode electrode, and a cathode electrode CE formed on the organic light emitting layer. The organic light emitting diode OLED displays a predetermined image by emitting light in accordance with the data current supplied from the driving transistor Tdr.

The display driving circuit (not shown) may drive the plurality of pixels P by a sensing mode. In this case, the driving transistor Tdr of each pixel P is driven as a source follower. First, a threshold voltage and/or mobility of the driving transistor Tdr may be sensed through the second switching transistor Tsw2 and the sensing line SL, and a compensation voltage for compensating the threshold voltage and/or mobility of the driving transistor Tdr by each pixel based on the sensing data of the driving transistor Tdr by each pixel is reflected on the data signal Vdata, to thereby compensate for the change of properties in the driving transistor Tdr by each pixel.

The cathode electrode CE for each of the plurality of pixels P is a cathode electrode layer prepared on the substrate 110, and the cathode electrode layer is connected to a cathode power supply line 123 prepared in the non-display area of the substrate 110.

Referring once again to FIG. 2, the display pad portion 130 is prepared in the outer edge of the upper neck portion 113, and is connected to the display driving circuit (not shown). The display pad portion 130 may include first and second driving power pads respectively connected to both ends of the driving power supply line 121, first and second cathode power pads respectively connected to both ends of the cathode power supply line 123, a plurality of gate pads connected by an one-to-one correspondence to the plurality of gate control signal lines, first and second reference power pads respectively connected to both ends of the reference power line 140, and a plurality of data pads connected by an one-to-one correspondence to the plurality of data link lines DLL1 to DLLm.

With respect to the center of the substrate 110, the plurality of data link lines DLL1 to DLLm are compactly prepared in an upper side of the non-display area for an one-to-one correspondence between the plurality of data lines DL1 to DLm and the data pad of the display pad portion 130. The plurality of data link lines DLL1 to DLLm have the different lengths in accordance with each position of the data lines DL1 to DLm prepared in the image display portion 120. For example, the plurality of data link lines DLL1 to DLLm are prepared in a routing area adjacent to the image display portion 120, and are connected to an upper end of each of the plurality of data lines DL1 to DLm connected to the outermost pixel P of the image display portion 120. Accordingly, the middle data link line DLLi connected to the middle data line DLi has the shortest length, and each of the first and last data link lines DLL1 and DLLm respectively connected to the first and last data lines DL1 and DLm has the longest length. Thus, the length in the plurality of data link lines DLL1 to DLLm may be symmetric with respect to a central line of a second direction (Y) of the image display portion 120.

The reference power line 140 is prepared on the curve portion 111 and the neck portion 113 of the substrate 110 to surround the image display portion 120 except the upper edge of the image display portion 120 confronting the display pad portion 130. That is, the reference power line 140 may include a circumference line surrounding the image display portion 120, and a reference power connection line connected from both ends of the circumference line to first and second reference power pads of the display pad portion 130. The reference power line 140 is supplied with reference power from the external display driving circuit, wherein the reference power may be a ground voltage, or a reference voltage having a preset positive voltage value or a preset negative voltage value.

The plurality of metal dummy patterns MDP are prepared in the non-display area of the substrate 110, wherein each of the plurality of metal dummy patterns MDP is entirely or partially overlapped with the plurality of data link lines DLL1 to DLLm and is connected to the reference power line 140. According as an outer edge of each of the metal dummy patterns MDP is electrically connected to the reference power line 140 through one or more contact holes (not shown), each of the metal dummy patterns MDP is supplied with the reference power from the reference power line 140.

The plurality of metal dummy patterns MDP are provided at fixed intervals along a lengthwise direction of the data line DL so that each of the metal dummy patterns MDP crosses the data link line DLL between the circumference of the image display portion 120 and the reference power line 140. In this case, the plurality of metal dummy patterns MDP may be prepared between the upper non-display area of the substrate 110 adjacent to the upper side of the image display portion 120 and the left and right non-display area of the substrate 110 adjacent to the central circumference of the image display portion 120. Among the plurality of metal dummy patterns MDP, the upper metal dummy pattern MDP, which is adjacent to the display pad portion 130, may not be overlapped with the two or more middle data link lines connected to the two or more data lines prepared in the central area of the image display portion 120.

According as the plurality of metal dummy patterns MDP are formed along the circumference of the image display portion 120, the length of the metal dummy pattern MDP is gradually decreased from the upper non-display area of the substrate 110 toward the left and right non-display area of the substrate 110. Thus, the number of metal dummy patterns MDP overlapped with the plurality of data link lines DLL1 to DLLm is gradually increased from the middle data link line DLLi to the first and last data link lines DLL1 and DLLm. For example, the middle data link line DLLi may be overlapped with one metal dummy pattern MDP, and each of the first and last data link lines DLL1 and DLLm may be overlapped with all the metal dummy patterns MDP.

Each of the plurality of metal dummy patterns MDP is formed at the same layer as the gate line GL while being overlapped with the data link line DLL, wherein each of the plurality of metal dummy patterns MDP is not electrically connected to the data line DL, the gate line GL and the data link line DLL, and is covered by a gate insulating film (not shown). Accordingly, one or more dummy capacitors may be formed at each intersection between the plurality of data link lines DLL1 to DLLm and the plurality of metal dummy patterns MDP by the gate insulating film. In this case, each of the plurality of metal dummy patterns MDP is used as a lower electrode of the dummy capacitor.

The number of dummy capacitors prepared in each of the plurality of data link lines DLL1 to DLLm is gradually increased from the middle data link line DLLi to each of the first and last data link lines DLL1 and DLLm. That is, the number of dummy capacitors prepared in the data link line DLL is increased in accordance with the increase in length of the data link line DLL. Also, a total dummy capacitance of the data link line DLL in accordance with the dummy capacitor prepared in the data link line DLL is increased in accordance with the increase in length of the data link line DLL.

Accordingly, the number of dummy capacitors is gradually increased from the middle data link line DLLi to each of the first and last data link lines DLL1 and DLLm.

The dummy capacitor divides a voltage charged in a parasitic capacitance between the adjacent data link lines DLL, whereby it is possible to minimize a voltage variation of the data link line DLL in accordance with a voltage coupling phenomenon by the parasitic capacitance between the adjacent data link lines DLL. That is, the dummy capacitor minimizes a voltage coupling deviation in accordance with the parasitic capacitance by each position of the data link lines DLL, thereby minimizing an inferior image caused by the coupling phenomenon in accordance with the parasitic capacitance by each position of the data link lines DLL. Especially, the number of dummy capacitors prepared in the data link line is gradually increased from the middle data link line DLLi to each of the first and last data link lines DLL1 and DLLm, to thereby minimize the voltage coupling deviation which becomes serious in the left and right edges of the image display portion 120 in accordance with the parasitic capacitance by each position of the data link lines DLL.

For example, if red and blue pixels are disposed adjacent to each other, as shown in the following equation 1, a capacitance occurring between a red data link line connected to the red pixel and a blue data link line connected to the blue pixel is referred to as a first parasitic capacitance C1, and a remaining capacitance which has an influence on the red data link line except the first parasitic capacitance C1 is referred to as a second parasitic capacitance C2. In this case, a total capacitance Ctotal of the red data link line may be obtained by adding the first parasitic capacitance and the second parasitic capacitance, that is, C1+C2. A voltage variation $\Delta'V_R$ supplied to the red data line in accordance with the voltage coupling effect by the parasitic capacitance between the adjacent data link lines DLL is obtained as shown in the following equation 1 by the voltage division of the first and second parasitic capacitances C1 and C2, $$C_{total} = C1 + C2$$

$$\Delta V_R = \frac{C1}{C_{total}} \times V_B = \frac{C1}{C1+C2} \times V_B \qquad \text{equation 1}$$

As described above, if the dummy capacitor Cd is prepared in the data link line, the voltage variation Δ'VR supplied to the red data line by the dummy capacitor Cd is obtained as shown in the following equation 2 by the voltage division of the first and second parasitic capacitances C1 and C2 and the dummy capacitor Cd, $$\Delta V'_R = \frac{C1}{C1+C2+Cd} \times V_B \qquad \text{equation 2}$$

Accordingly, the voltage variation $\Delta'V_R$ supplied to the red data line in accordance with the voltage coupling effect by the parasitic capacitance between the adjacent data link lines is lowered by the dummy capacitor Cd prepared in the data link line.

Eventually, the dummy capacitor Cd is prepared in the data link lines DLL by the plurality of metal dummy patterns MDP overlapped with the data link lines DLL, whereby it is possible to minimize the voltage coupling deviation which becomes serious in the left and right edges of the image display portion 120 in accordance with the parasitic capacitance by each position of the data link lines DLL.

Meanwhile, each of the plurality of metal dummy patterns MDP may be connected to the driving power supply line 121 or cathode power supply line 123 without being connected to the reference power line 140. Even in this case, it is possible to minimize the voltage variation of the data link line DLL in accordance with the voltage coupling phenomenon by the parasitic capacitance between the adjacent data link lines DLL. As a result, each of the plurality of metal dummy patterns MDP may be connected to the driving power supply line 121 or cathode power supply line 123. However, for convenience of an electric connection, each of the plurality of metal dummy patterns MDP is connected to any one line which is most adjacent to the image display portion 120, and more preferably, to the cathode power supply line 123.

The display apparatus according to the first embodiment of the present invention includes the dummy capacitor prepared in the data link lines DLL by the plurality of metal dummy patterns MDP overlapped with the plurality of data link lines DLL so that it is possible to minimize the voltage variation of the data link line DLL in accordance with the voltage coupling phenomenon by the parasitic capacitance between the adjacent data link lines DLL. Especially, the number of dummy capacitors prepared in the data link line DLL is gradually increased from the middle data link line DLLi to each of the first and last data link lines DLL1 and DLLm, to thereby minimize the voltage coupling deviation which becomes serious in the left and right edges of the image display portion 120. As a result, an influence of the parasitic capacitance between the data link lines DLL becomes uniform through the dummy capacitor prepared by the plurality of metal dummy patterns MDP overlapped with the plurality of data link lines DLL, thereby preventing or minimizing an inferior image caused by the parasitic capacitance between the adjacent data link lines DLL.

Figure 5:
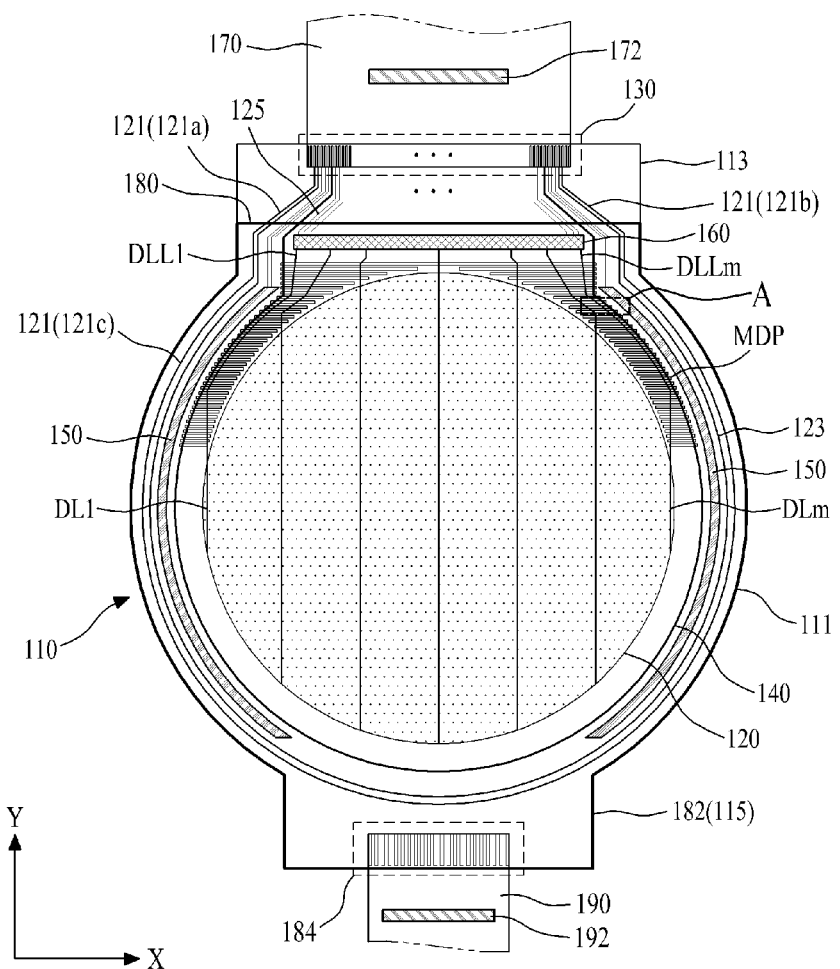
FIG. 5 illustrates a display apparatus according to a second example embodiment of the present invention.

FIG. 5 illustrates a display apparatus according to a second example embodiment of the present invention.

With reference to FIG. 5, the display apparatus according to the second embodiment of the present invention may include a substrate 110, an image display portion 120, a display pad portion 130, a reference power line 140, a plurality of metal dummy patterns MDP, a gate driving circuit 150, a time-division data output portion 160, a plurality of data link lines DLL1 to DLLm, a flexible circuit board 170, and a barrier film 180.

The substrate 110 of FIG. 5 is the same as the substrate shown in FIGS. 2 to 4, wherein the substrate 110 of FIG. 5 includes a curve portion 111, an upper neck portion 113, and a lower neck portion 115. A detailed description for the same parts as those of the aforementioned embodiment will be omitted.

A support substrate (not shown) may be additionally attached to a rear surface of the substrate 110, wherein the support substrate maintains a shape of the substrate 110. The support substrate may be formed of any one material among PET (polyethyleneterephthalate), PC (polycarbonate), PES (polyethersulfone), PEN (polyethylenapthanate), and PNB (polynorborneen).

The image display portion 120 is prepared in a display area of the curve portion 111. In a non-display area of the substrate 110 except the display area, there are the plurality of data link lines DLL1 to DLLm, the reference power line 140, the plurality of metal dummy patterns MDP, the gate driving circuit 150, and the time-division data output portion 160. Also, a driving power supply line 121 and a cathode power supply line 123, which are connected to the image display portion 120, are additionally formed in the non-display area of the substrate 110 except the display area.

The driving power supply line 121 having a constant width and thickness is prepared in the non-display area of the substrate 110 along an outer circumference of the image display portion 120. Both ends of the driving power supply line 121 are connected to the display pad portion 130 prepared in the upper neck portion 113. Accordingly, the driving power supply line 121 may include a pair of driving power pad connection lines 121a and 121b connected to the display pad portion 130, and a driving power circumference line 121c provided along the outer circumference of the image display portion 120 and connected to the pair of driving power pad connection lines 121a and 121b. The driving power supply line 121 may function as a main power line for supplying a pixel driving power source Vdd from the display pad portion 130 to a plurality of pixel power lines PL prepared in the image display portion 120.

The cathode power supply line 123 having a constant width and thickness is prepared in the non-display area of the substrate 110 between the driving power supply line 121 and the image display portion 120 along the outer circumference of the image display portion 120. Both ends of the cathode power supply line 123 are connected to the display pad portion 130. According to an example, a structure of the cathode power supply line 123 may be the same as a structure of the driving power supply line 123, and the cathode power supply line 123 may be parallel to the driving power supply line 121. According as the cathode power supply line 123 is connected to a cathode electrode prepared in the image display portion 120, a cathode power is supplied from the display pad portion 130 to organic light emitting diodes OLED of all pixels P.

The cathode power supply line 123 is prepared between the driving power supply line 121 and the image display portion 120, to thereby reduce a bezel width of the display apparatus according to the present invention. That is, the cathode electrode prepared on the image display portion 120 and connected to the cathode power supply line 123 is covered by a protection layer (not shown), wherein the protection layer is formed of an organic material enabling a good moisture transmission. In order to prevent the organic light emitting diode OLED from being damaged by moisture permeating through the protection layer, the protection layer is provided at a predetermined interval from the outer surface of the substrate 110. According as the cathode power supply line 123 is disposed between the driving power supply line 121 and the image display portion 120, the outer surface of the protection layer is provided at a predetermined interval from the outer surface of the substrate 110 so that it is possible to reduce a bezel width of the display apparatus defined by a width between the outer surface of the substrate 110 and the image display portion 120. Accordingly, the image display portion 120 and the curve portion 111 of the substrate 110 may be formed in a concentric circle shape.

Additionally, the cathode power supply line 123 may be disposed between the driving power supply line 121 and the outer surface of the substrate 110. In this case, since the edge of the substrate 110 is extended toward the outside, the outer surface of the protection layer is provided at a predetermined interval from the outer surface of the substrate 110, whereby it causes the increase of bezel width in the display apparatus.

The image display portion 120 is prepared in a display area defined on the curve portion 111 of the substrate 110. The image display portion 120 may include a pixel array, wherein the pixel array may a plurality of data lines DL1 to DLm, a plurality of gate lines (not shown), a plurality of pixel power lines (not shown), and a plurality of pixels (not shown). The pixel array is the same as the pixel array shown in FIGS. 2 to 4, whereby a detailed description for the pixel array will be omitted.

The image display portion 120 is covered by an encapsulation layer (not shown), wherein the encapsulation layer may be formed of an organic material layer or an inorganic material layer, or a multi-layered structure including organic and inorganic material layers alternately deposited.

The display pad portion 130 is prepared in an outer edge of the upper neck portion 113, and is connected to the flexible circuit board 170. The display pad portion 130 may include first and second driving power pads, first and second cathode power pads, a plurality of gate pads, first and second reference power pads, and a plurality of data pads.

For a process of manufacturing a thin film transistor for each pixel P, the gate driving circuit 150 having a circular arc along an outer circumference of the image display portion 120 is formed in a non-display area of the substrate 110, connected to each of the gate lines GL, and also connected to a gate pad of the display pad portion 130 through a gate control signal line. The gate driving circuit 150 generates a gate signal in response to a gate control signal supplied through the display pad portion 130 and the gate control signal line, and sequentially supplies the generated gate signal to the plurality of gate lines GL. According to an example, the gate driving circuit 150 may be prepared along left or right circumference of the image display portion 120, and the gate signal may be supplied to one end or the other end of each of the plurality of gate lines GL. According to another example, the gate driving circuit 150 may be prepared along left and right circumferences of the image display portion 120, and the gate signal may be supplied to one end and the other end of each of the plurality of gate lines GL at the same time. According to another example, the gate driving circuit 150 may be prepared along left and right circumferences of the image display portion 120, and the gate signal may be supplied to one end of the odd-numbered gate line GL, and the other end of the odd-numbered gate line GL.

Additionally, as shown in FIG. 4, if each pixel P prepared in the image display portion 120 includes a second switching transistor Tsw2, the gate driving circuit 150 generates a sensing control signal corresponding to a driving mode of the pixel P, and supplies the generated sensing control signal to a sensing control line SCL. In this case, if the second switching transistor Tsw2 is switched by the gate signal supplied to the gate line, the gate driving circuit 150 generates only the gate signal and supplies the gate signal to the gate line without generating the sensing control signal, as described above.

The time-division data output portion 160 is prepared between the image display portion 120 and the display pad portion 130. The time-division data output portion 160 time-divides a data signal supplied from the display pad portion 130, and sequentially supplies the data signal to the two or more data lines DL included in each of a plurality of data groups. According to an example, the time-division data output portion 160 may include a plurality of multiplexers for a time-division driving in a plurality of pixels constituting a unit pixel in response to a data selective signal.

Each of the plurality of multiplexers may include one input channel supplied with the data signal, a control channel supplied with the data selective signal, and two or more output channels for sequentially outputting the data signal to the data group. Generally, each unit pixel may include red, green and blue pixels, generally. For an easy time-division driving of the unit pixel, each data group may include three data lines. In this case, each of the plurality of multiplexers may 3i-numbered output channels ('i' is an integer). Eventually, the number of data lines included in each data group and the number of output channels in the multiplexer may correspond to the number of pixels constituting one unit pixel, or the number corresponding to an integer multiple of the pixels constituting one unit pixel, preferably.

The time-division data output portion 160 is connected to the display pad portion 130 through a plurality of data input lines 125, wherein the number of data input lines 125 corresponds to the number of multiplexers. Also, the time-division data output portion 160 is connected by an one-to-one correspondence to the plurality of data lines DL1 to DLm through the plurality of data link lines DLL1 to DLLm. Accordingly, the number of data pads prepared in the display pad portion 130 is reduced to the number of multiplexers constituting the time-division data output portion 160 to be correspond with the plurality of data lines DL1 to DLm, to thereby reduce a width of the upper neck portion 113, and realizing the non-display area of the substrate 10 to have a circle shape.

The plurality of data link lines DLL1 to DLLm are prepared in a curved-line shape between the time-division data output portion 160 and the data lines DL1 to DLm, whereby the plurality of data lines DL1 to DLm are connected by an one-to-one correspondence to the time-division data output portion 160 through the plurality of data link lines DLL1 to DLLm. As described in the above first embodiment of the present invention, the plurality of data link lines DLL1 to DLLm have the different lengths in accordance with each position of the data lines DL1 to DLm prepared in the image display portion 120.

The reference power line 140 is prepared on the curve portion 111 and the upper neck portion 113 of the substrate 110 to surround the image display portion 120 except the upper edge of the image display portion 120 confronting the display pad portion 130. The reference power line 140 is supplied with reference power from the flexible circuit board 170, wherein the reference power may be a ground voltage, or a reference voltage having a preset positive voltage value or a preset negative voltage value. The reference power line 140 may be supplied with a pixel driving power or a cathode power instead of the reference power from the flexible circuit board 170.

Figure 6A:
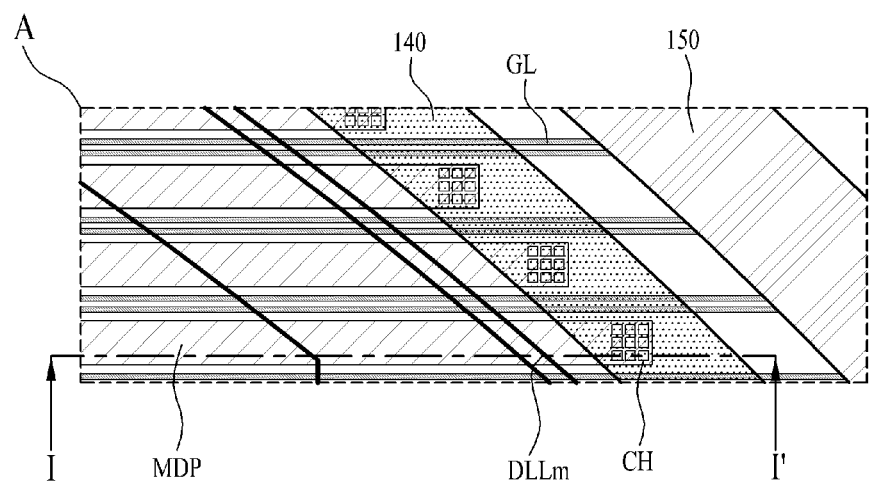
FIG. 6A is an expanded view of 'A' portion shown in FIG. 5.
Figure 6B:
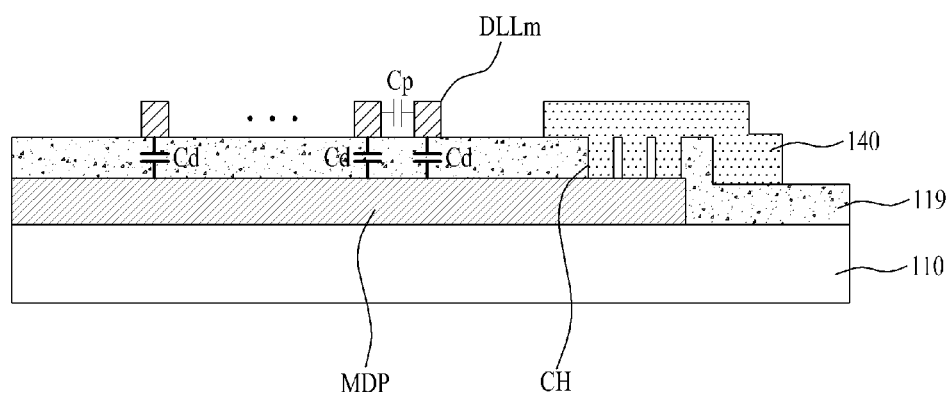
FIG. 6B is a cross sectional view along I-I' of FIG. 6A.

The plurality of metal dummy patterns MDP are prepared in a routing area among the image display portion 120, the gate driving circuit 150 and the time-division data output portion 160, wherein the plurality of metal dummy patterns MDP are overlapped with the plurality of data link lines DLL1 to DLLm and are connected to the reference power linen 140. That is, the plurality of metal dummy patterns MDP are prepared in the non-display area of the substrate 110 provided with the plurality of data link lines DLL1 to DLLm. As shown in FIGS. 6A and 6B, as an outer edge of each of the metal dummy patterns MDP is electrically connected to the reference power line 140 through one or more contact holes CH, whereby each of the metal dummy patterns MDP is supplied with the reference power from the reference power line 140.

Each of the plurality of metal dummy patterns MDP is formed at the same layer as the gate line GL on the substrate 110 while being overlapped with the data link line DLL, wherein each of the plurality of metal dummy patterns MDP is not electrically connected to the data line DL, the gate line GL and the data link line DLL, and is covered by a gate insulating film 119. Each of the plurality of metal dummy patterns MDP may be prepared between each of the gate lines GL, wherein an area of each of the metal dummy patterns MDP is relatively larger than an area of each of the gate lines GL. Also, a dummy capacitor Cd is formed at each intersection between the plurality of data link lines DLL1 to DLLm and the plurality of metal dummy patterns MDP by the gate insulating film 119, and each of the metal dummy patterns MDP is used as a lower electrode of the dummy capacitor Cd. A shape and arrangement of the metal dummy patterns MDP are the same as those of the first embodiment of the present invention, whereby a detailed description for the metal dummy patterns MDP will be omitted.

In the same manner as the first embodiment of the present invention, the dummy capacitor Cd minimizes the voltage variation of the data link lines DLL in accordance with the voltage coupling phenomenon by the parasitic capacitance Cp between the adjacent data link lines DLL by the division of voltage charged in the parasitic capacitance between the adjacent data link lines DLL, as shown in the above equation 2. Herein, a repetitive explanation will be omitted.

Referring once again to FIG. 5, the flexible circuit board 170 is attached to the display pad portion 130 by a film bonding process. The flexible circuit board 170 may be formed of TCP (Tape Carrier Package), COF (Chip On Flexible Board or Chip On Film), or FPC (Flexible Printed Circuit). The flexible circuit board 170 is bent toward the rear of the substrate 110 to cover lateral surfaces of the substrate 110, and is then connected to a driving system (not shown).

A display driving integrated circuit 172 is mounted on the flexible circuit board 170. The display driving integrated circuit 172 receives video data and timing synchronized signal from the driving system, coverts the video data into a data signal in accordance with the timing synchronized signal, supplies the data signal to the time-division data output portion 160 through the display pad portion 130, generates a gate control signal in accordance with the timing synchronized signal, and supplies the generated gate control signal to the gate driving circuit 150 through the display pad portion 130.

The display driving integrated circuit 172 may be mounted on a chip-mounting area prepared on the upper neck portion 113, instead of the flexible circuit board 170, and may be connected to the display pad portion 130 and the time-division data output portion 160.

In the flexible circuit board 170 is provided with a plurality of power lines for transmitting pixel driving power, cathode power and reference power from a power circuit of the driving system to the display pad portion 130.

The barrier film 180 according to an example is attached to an upper surface of the encapsulation layer by the use of transparent adhesive (not show), to thereby cover an upper side of the substrate 110 except the display pad portion 130. The barrier film 180 may be formed of a material having a low level of moisture transmission, for example, polymer. A touch screen (not shown) may be disposed on the barrier film 180 according to an example. The touch screen may include a touch base film, a touch sensor prepared in the touch base film, and a touch pad projected (or extended) from a lower side of the base film, connected to the touch sensor and supported by the lower neck portion 115 prepared in the substrate 110.

The barrier film 180 according to another example may include a base film, a touch sensor (not shown) prepared in the base film, and a touch circuit connector 182 projected (or extended) from a lower side of the base film.

The base film may be formed of a material having a low level of moisture transmission, for example, polymer.

The touch sensor may include a plurality of touch sensing lines and a plurality of touch driving lines prepared in a touch sensing area defined on the base film and overlapped with the image display portion 120.

The touch circuit connector 182 having a predetermined size is projected (or extended) from the lower side of the base film, and is supported by the lower neck portion 115 prepared in the substrate 110. The touch circuit connector 182 may include a plurality of touch driving link lines connected by an one-to-one correspondence to the plurality of touch driving lines prepared in the touch sensing area, a plurality of touch sensing link lines connected by an one-to-one correspondence to the plurality of touch sensing lines prepared in the touch sensing area, and a plurality of touch pads for connecting the plurality of touch driving link lines to the plurality of touch sensing link lines by an one-to-one correspondence.

The touch pad portion 184 is connected to the touch flexible circuit board 190 by a film bonding process, wherein the touch pad portion 184 is bent toward the rear of the substrate 110 to cover the lateral surface of the substrate 110, and is connected to the touch driving circuit (not shown) or driving system. In this case, a touch driving integrated circuit 192, which is connected to the touch sensing portion through the touch pad portion 184 so as to sense a user's touch and to generate sensing data, may be mounted on the touch driving integrated circuit 190.

Additionally, a polarizing film (not shown) may be attached to an upper surface of the barrier film 180. Also, a cover window (not show) of a transparent material having a circular shape may be attached to an upper surface of the polarizing film.

In the same manner as the display apparatus according to the first embodiment of the present invention, the display apparatus according to the second embodiment of the present invention prevents or minimizes an inferior image, which is caused by the parasitic capacitance between the adjacent data link lines DLL, through the plurality of metal dummy patterns MDP. Also, the number of data pads prepared in the display pad portion 130 is reduced by the time-division data output portion 160 so that it is possible to reduce a width of the upper neck portion 113, and thus to realize the non-display area of the substrate 100 in a nearly circle shape.

Figure 7:
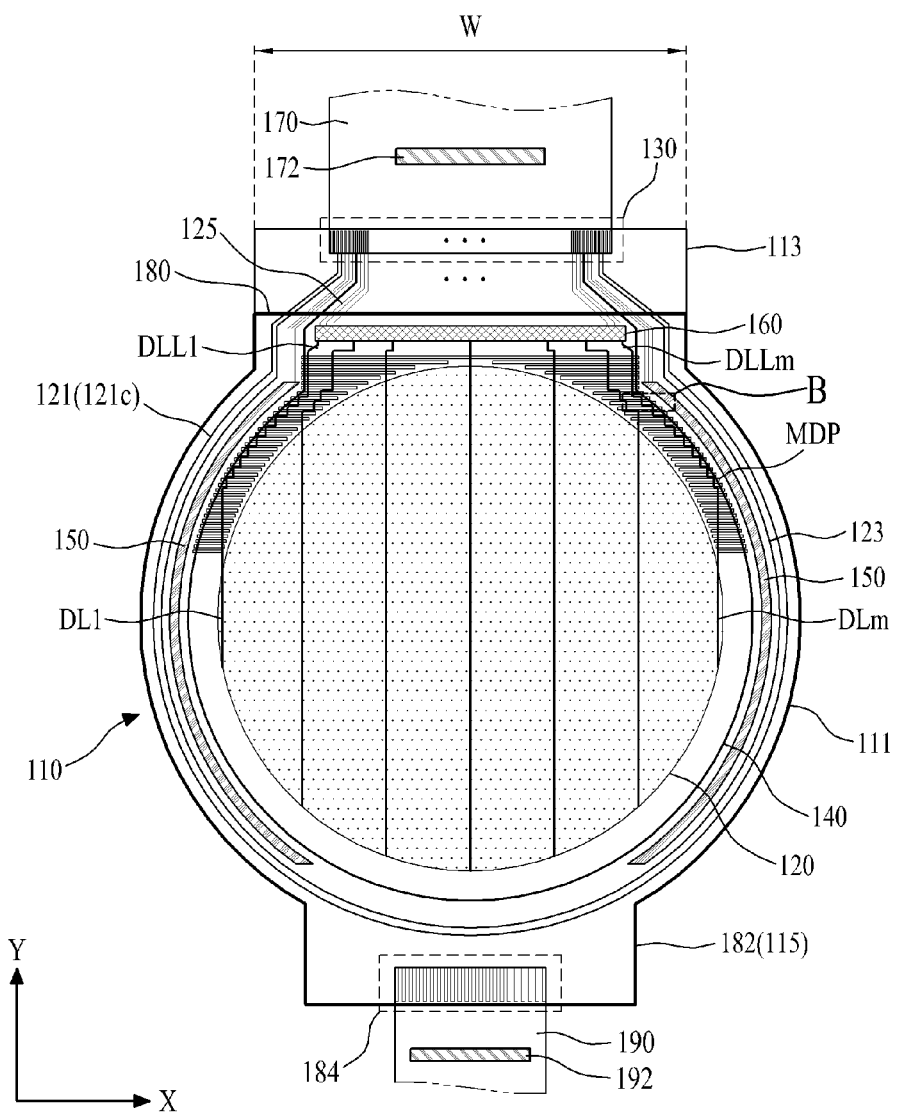
FIG. 7 illustrates a display apparatus according to a third example embodiment of the present invention.
Figure 8:
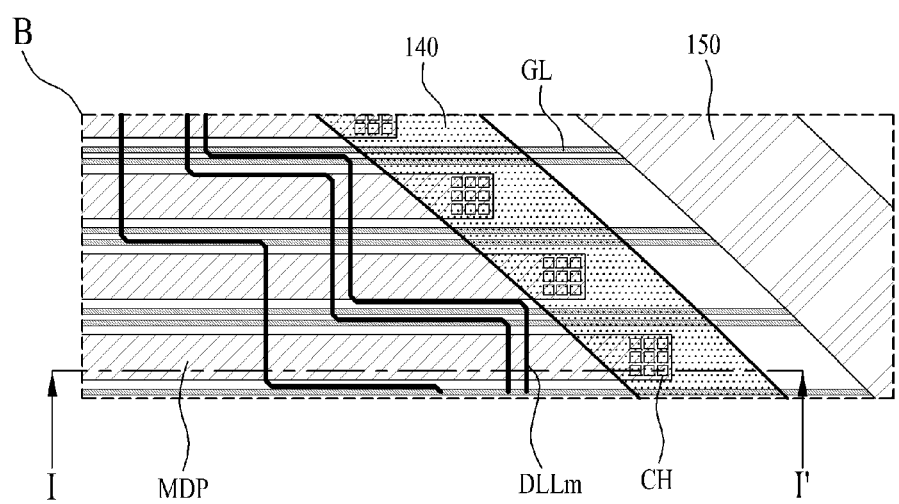
FIG. 8 is an expanded view of 'B' portion shown in FIG. 7.

FIG. 7 illustrates a display apparatus according to a third example embodiment of the present invention, and FIG. 8 is an expanded view of 'B' portion shown in FIG. 7. This is obtained by changing a structure in the plurality of data link lines of the display apparatus according to the second embodiment of the present invention. Hereinafter, only the data link lines will be described in detail.

The plurality of data link lines DLL1 to DLLm are prepared in a stair shape, and are provided to connect a time-division data output portion 160 and a plurality of data lines DL1 to DLm by an one-to-one correspondence. In the same manner as the aforementioned first embodiment of the present invention, the plurality of data link lines DLL1 to DLLm have the different lengths in accordance with each position of the data lines DL1 to DLm prepared in an image display portion 120.

In the display apparatus according to the third embodiment of the present invention, the plurality of data link lines DLL1 to DLLm are prepared in the stair shape so that it is possible to reduce a width W of an upper neck portion 113 projected from a curve portion 111 of a substrate 110, and to reduce a width (or interval) between an outer surface of the curve portion 111 of the substrate 110 and the image display portion 120. Thus, the curve portion 111 of the substrate 110 together with the image display portion 120 is formed in a concentric shape so that it is possible to reduce a bezel width of the display apparatus.

Figure 9:
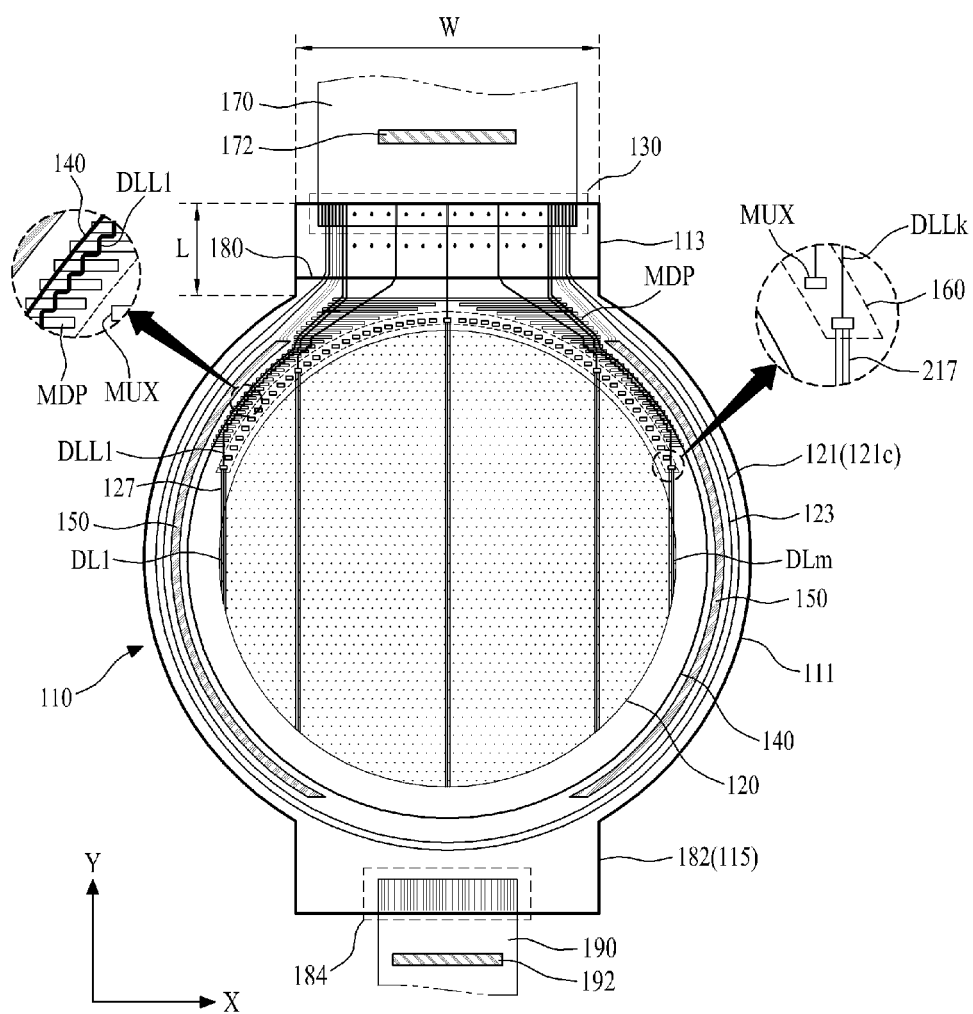
FIG. 9 illustrates a display apparatus according to a fourth example embodiment of the present invention.

FIG. 9 illustrates a display apparatus according to a fourth example embodiment of the present invention, which is obtained by changing a structure in the time-division data output portion of the display apparatus according to the third embodiment of the present invention. Hereinafter, only the time-division data output portion and its related structure will be described in detail as follows.

The time-division data output portion 160 is prepared in a stair shape along the circumference of image display portion 120, wherein the time-division data output portion 160 includes a plurality of multiplexers MUX respectively connected in each unit comprising two or more data lines DL.

The plurality of multiplexers MUX are provided in the stair shape along the circumference of the image display portion 120, wherein the plurality of multiplexers MUX are connected by an one-to-one correspondence to the plurality of data groups, wherein each data group includes two or more data lines, whereby the data lines included in each data group are driven in a time-division method. That is, each of the plurality of multiplexers MUX according to an example sequentially supplies a data signal, which is supplied through a data link line DLL1 to DLLk, to the data lines DL included in the corresponding data group in response to a data selective signal. To this end, an input channel in each of the plurality of multiplexers MUX is connected to a data pad of a display pad portion 130 through the data link line DLL1 to DLLk, and output channels of each of the plurality of multiplexers MUX may be connected by an one-to-one correspondence to the data lines included in the corresponding data group. In this case, as described above, each of the plurality of multiplexers MUX may have the 3i-numbered output channels ('i' is an integer)

Additionally, the plurality of data link lines DLL1 to DLLk are formed in the stair shape between the display pad portion 130 and the time-division data output portion 160.

The plurality of data link lines DLL1 to DLLk are overlapped with the aforementioned plurality of metal dummy patterns MDP, whereby a dummy capacitor is prepared in the plurality of data link lines DLL1 to DLLk. Except that the plurality of metal dummy patterns MDP are overlapped with the plurality of data link lines DLL1 to DLLk for connecting the display pad portion 130 and the time-division data output portion 160, and the dummy capacitor is prepared in the plurality of data link lines DLL1 to DLLk, the structure is the same as that of the aforementioned embodiment, whereby a detailed description for the same parts will be omitted.

In the display apparatus according to the fourth embodiment of the present invention, the multiplexers MUX of the time-division output portion 160 are provided in the stair shape along the circumference of the image display portion 120, whereby the upper neck portion 113 projected from the curve portion 111 of the substrate 110 may be decreased in width W and length L. Accordingly, the curve portion111 of the substrate 110 becomes more close to a concentric shape so that it is possible to reduce a bezel width of the display apparatus.

Figure 10:
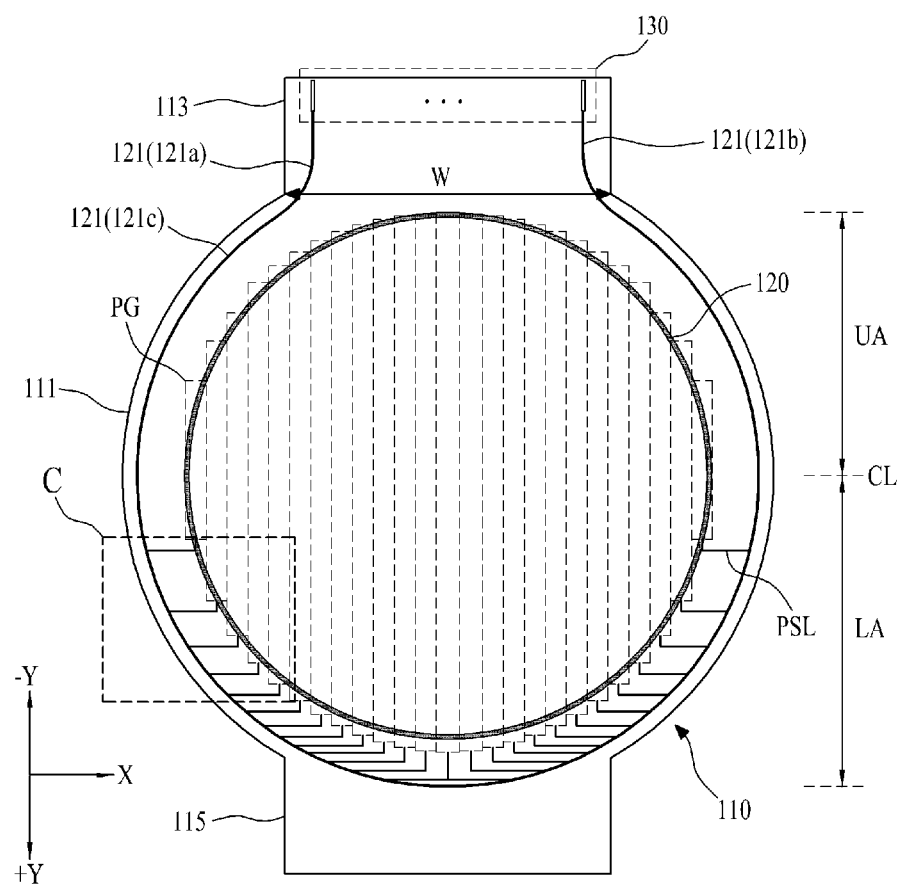
FIG. 10 illustrates a connection structure between a driving power supply line and a pixel in the display apparatuses according to the first to fourth embodiments of the present invention.
Figure 11:
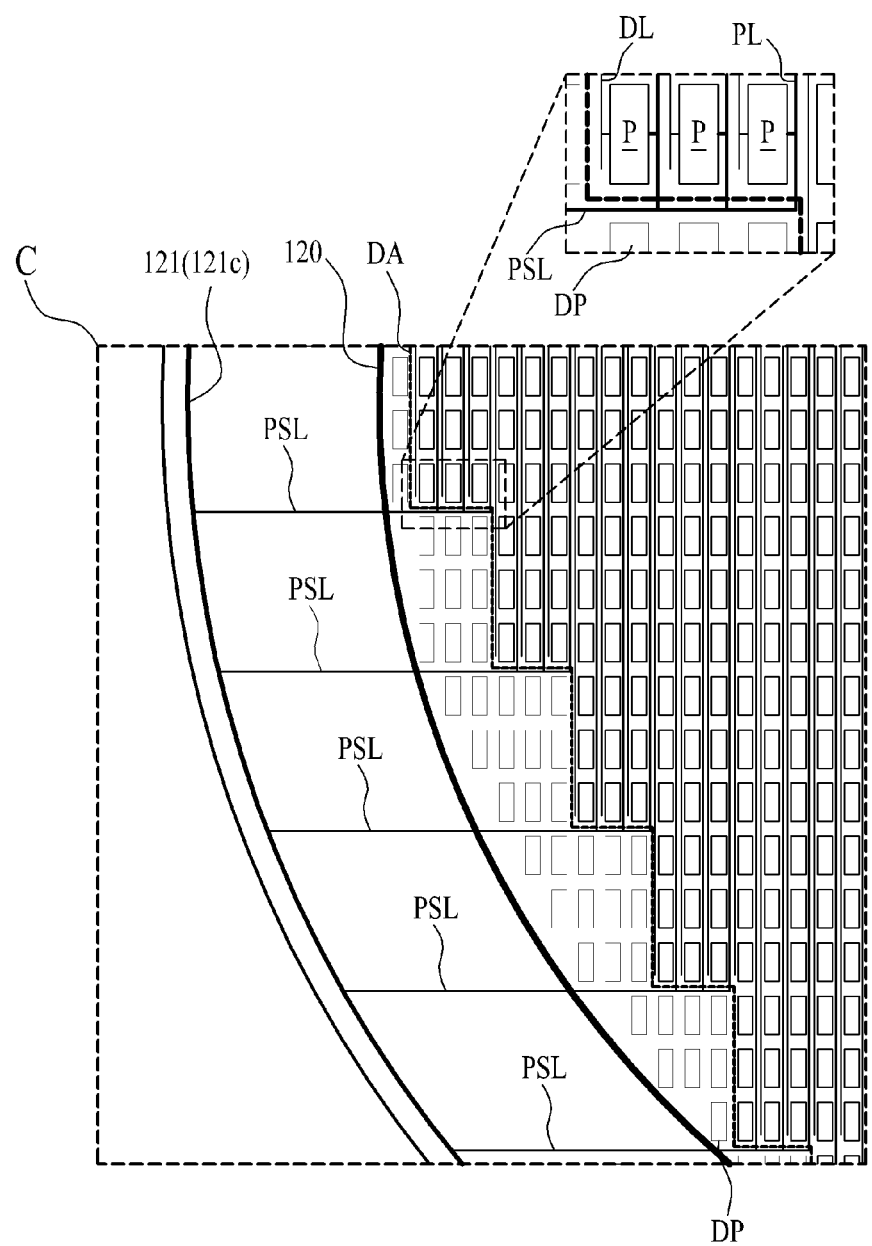
FIG. 11 is an expanded view of 'C' portion shown in FIG. 10.

FIG. 10 illustrates a connection structure between the driving power supply line and the pixel in the display apparatuses according to the first to fourth embodiments of the present invention, and FIG. 11 is an expanded view of 'C' portion shown in FIG. 10.

With reference to FIGS. 10 and 11 in connection with FIG. 3 (or FIG. 4), a supply direction of the data signal Vdata supplied to each pixel P may be opposite to a supply direction of the pixel driving power source Vdd supplied to each pixel P. That is, the supply direction (+Y) of the data signal Vdata may be a first direction (+Y) from one side (or upper side) of the image display portion 120 toward the other side (or lower side) of the image display portion 120. Meanwhile, the supply direction (-Y) of the pixel driving power source Vdd may be a second direction (-Y) from the other side of the image display portion 120 toward one side of the image display portion, wherein the second direction (-Y) may be opposite to the first direction (+Y). To this end, the display apparatus according to the present invention may further include a plurality of power sharing lines PSL.

The plurality of power sharing lines PSL according to an example electrically connect each of the plurality of pixel power lines PL to the driving power circumference line 121c of the driving power supply line 121. Each of the power sharing lines PSL may extend outward away from the driving power circumference line 121c of the driving power supply line 121 in parallel with the gate line between the adjacent pixels P along the lengthwise direction Y of the data line DL, and may be connected to the plurality of pixel power lines PL by an one-to-one correspondence. In this case, each of the plurality of power sharing lines PSL is formed so as not to cross the data line DL to avoid signal interference between the pixel driving power source Vdd and the data signal Vdata, preferably.

Therefore, each of the power sharing lines PSL according to an example allows the pixel driving power source Vdd to be supplied to the direction (-Y) opposite to the supply direction (+Y) of the data signal Vdata by supplying the pixel driving power source Vdd supplied to the driving power supply line 121 to a lower end of each of the plurality of pixel power lines PL. As a result, the present invention may resolve picture quality deterioration or luminance non-uniformity, which is caused by deviation of the data signal Vdata based on resistance of the data line DL by each position of each pixel P and deviation of the pixel driving power source Vdd based on resistance of the pixel power line PL. For example, in a middle pixel (hereinafter, referred to as "first middle pixel") of the first horizontal line and a middle pixel (hereinafter, referred to as "second middle pixel") of the last horizontal line, if the supply direction of the data signal Vdata and the supply direction of the pixel driving power source Vdd are the same, a voltage drop of each of the data signal Vdata and the pixel driving power source Vdd occurs more frequently in the second middle pixel than the first middle pixel, whereby a luminance deviation between the first and second middle pixels occurs even in case of the same data signal Vdata. In contrast, if the supply direction of the data signal Vdata and the supply direction of the pixel driving power source Vdd are opposite to each other, a voltage drop of the data signal Vdata occurs more frequently in the second middle pixel than the first middle pixel, and a voltage drop of the pixel driving power source Vdd occurs more frequently in the first middle pixel than the second middle pixel, whereby a deviation of the data signal Vdata and a deviation of the pixel driving power source Vdd may be mutually compensated, and thus a luminance deviation between the first and second middle pixels may be minimized in the same data signal Vdata.

Each of the plurality of power sharing lines PSL according to another example individually connects a plurality of pixel groups PG comprised of two or more pixels P to the driving power circumference line 121c of the driving power supply line 121. That is, each of the plurality of power sharing lines PSL is formed to be shared by two or more pixel power lines PL included in each pixel group PG without crossing the data line DL to avoid signal interference between the pixel driving power source Vdd and the data signal Vdata. In this case, each of the plurality of pixel groups PG may include two or more pixel rows of the pixel P connected to the data line DL and the pixel power line PL, wherein the pixel rows are set previously based on a curvature of the image display portion 120 and may be the same as or different from one another. Additionally, at least one dummy pixel DP may be included in the pixel rows, which are included in each of the plurality of pixel groups PG, by the curvature of the image display portion 120.

Each of the plurality of power sharing lines PSL according to another example is formed in parallel with the gate line to adjoin a lower portion of each pixel group PG, and is commonly connected to the pixel power line PL included in the corresponding pixel group PG. The driving power supply line 121, the plurality of power sharing lines PSL and the pixel power line PL may be formed at the same layer on the substrate 110. Each of the plurality of power sharing lines PSL according to another example commonly supplies the pixel driving power source Vdd, which is supplied to the driving power supply line 121, to the lower end of the pixel power lines PL included in the corresponding pixel group PG in a unit of each pixel group PG, whereby the pixel driving power source Vdd is supplied in the direction (−Y) opposite to the supply direction (+Y) of the data signal Vdata. As a result, as described above, the present invention may resolve picture quality deterioration or luminance non-uniformity, which is caused by deviation of the data signal Vdata based on resistance of the data line DL by each position of the pixel P and deviation of the pixel driving power source Vdd based on resistance of the pixel power line PL.

As described above, each of the plurality of power sharing lines PSL according to the present invention may be formed at a lower area LA of the curve portion 111 defined on the substrate 110 to supply the pixel driving power source Vdd to the lower end of the pixel power lines PL without crossing the data line DL. That is, the curve portion 111 has an upper area UA defined between the center line CL of the second direction Y of the image display portion 120 and one side (or upper side) of the imager display portion 120 and the lower area LA defined between the center line CL of the second direction Y of the image display portion 120 and the other side (or lower side) of the image display portion 120. Therefore, according to the present invention, the data link lines may be formed at the upper area UA of the curve portion 111, and the plurality of power sharing lines PSL may be formed at the lower area LA of the curve portion 111, whereby the formation area of the data link lines may spatially be spaced apart from the formation area of the power sharing lines PSL.

As a result, the width W of the upper neck portion 113 may be reduced by securing the formation area of the data link lines, and thus the curve portion 111 of the substrate 110 may be formed in a concentric shape with the image display portion 120, whereby a bezel width of the display apparatus may be reduced.

For the above description, the curve portion 111 and the image display portion 120 have the circle shape, but not limited to this shape. The image display portion 120 may have a non rectangular shape, for example, a semi-circle shape, an oval shape, a semi-oval shape, a heart shape, and etc., and the curve portion 111 may have the same shape as that of the image display portion 120 having the non rectangular shape.

According to the present invention, it is possible to minimize deterioration of picture quality in the image display portion by the voltage coupling occurring in the parasitic capacitance between the adjacent data link lines. Also, it is possible to provide the display apparatus having the image display portion and the thin bezel width.

It will be apparent to those skilled in the art that various modifications and variations can be made to embodiments of the present invention without departing from the spirit or scope of the invention. Thus, it is intended that the present invention covers the modifications and variations of this invention provided they come within the scope of the appended claims and their equivalents.

What is claimed is:
1. A display apparatus, comprising:
   a substrate having a display area defined in a non rectangular shape, and a non-display area surrounding the display area;
   an image display portion including a plurality of gate lines, a plurality of data lines and a plurality of pixels prepared on the display area;
   a display pad portion prepared at one side of the substrate;
   a plurality of data link lines for connecting the plurality of data lines to the display pad portion; and
   one or more dummy capacitors prepared in some data link lines among the plurality of data link lines.
2. The display apparatus according to claim 1, wherein the number of dummy capacitors prepared in the data link line is increased in accordance with the increase in length of the data link line.

3. The display apparatus according to claim 2, wherein a total dummy capacitance of the data link line in accordance with the dummy capacitor prepared in the data link line is increased in accordance with the increase in length of the data link line.

4. The display apparatus according to claim 1, wherein the number of dummy capacitors prepared in each of some data link lines is gradually increased from the middle data link line to each of the first and last data link lines.

5. The display apparatus according to claim 1, further comprising a plurality of metal dummy patterns overlapped with some data link lines among the plurality of data link lines,
wherein the dummy capacitor is prepared between the data link line and the metal dummy pattern.

6. The display apparatus according to claim 5, wherein the plurality of metal dummy patterns are provided at fixed intervals previously set along the circumference of the image display portion.

7. The display apparatus according to claim 5, wherein the plurality of metal dummy patterns are provided at the same layer as the gate line on the substrate.

8. The display apparatus according to claim 5, wherein the data link lines overlapped with the plurality of metal dummy patterns are provided in a stair shape.

9. The display apparatus according to claim 5, wherein each of a first and last data link lines is overlapped with all the metal dummy patterns.

10. The display apparatus according to claim 5, further comprising a reference power line prepared on the substrate along the circumference of the image display portion while being connected to the display pad portion and also connected to the plurality of metal dummy patterns.

11. The display apparatus according to claim 10, further comprising a gate driving circuit prepared on the substrate along the circumference of the image display portion and connected to the plurality of gate lines,
wherein the reference power line is prepared between the image display portion and the gate driving circuit on the substrate, and
wherein the plurality of metal dummy patterns are prepared between the image display portion and the gate driving circuit on the substrate, and are connected to the reference power line.

12. The display apparatus according to claim 5, further comprising:
a driving power supply line connected to the display pad portion and prepared on the substrate along the circumference of the image display portion; and
a cathode power supply line connected to the display pad portion, and prepared between the image display portion and the driving power supply line on the substrate along the circumference of the image display portion.

13. The display apparatus according to claim 12, wherein the plurality of metal dummy patterns are connected to the cathode power supply line.

14. The display apparatus according to claim 12, further comprising a plurality of power sharing lines for individually connecting a plurality of pixel groups to the driving power supply line,
wherein each of the plurality of pixel groups includes two or more pixels, and two or more pixel power lines respectively connected to the two or more pixels, and
wherein each of the plurality of power sharing lines is extended from the driving power supply line, and is shared by the pixel power lines included in each pixel group.

15. The display apparatus according to claim 5, further comprising a plurality of multiplexers for driving the plurality of data lines in a unit of two or more data lines by a time-division method,
wherein each of the plurality of multiplexers is connected to the corresponding data line through the plurality of data link lines.

16. The display apparatus according to claim 5, further comprising a plurality of multiplexers, which are prepared in a stair shape along the circumference of the image display portion, for driving the plurality of data lines in a unit of two or more data lines by a time-division method,
wherein each of the plurality of multiplexers is connected to the display pad portion through the plurality of data link lines.

* * * * *